United States Patent
Nishikawa et al.

(10) Patent No.: US 8,178,279 B2
(45) Date of Patent: May 15, 2012

(54) NEGATIVE RADIATION-SENSITIVE RESIN COMPOSITION

(75) Inventors: Kouji Nishikawa, Tokyo (JP); Akari Sako, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/973,930

(22) Filed: Dec. 21, 2010

(65) Prior Publication Data

US 2011/0086938 A1    Apr. 14, 2011

Related U.S. Application Data

(63) Continuation of application No. PCT/JP2009/060438, filed on Jun. 8, 2009.

(30) Foreign Application Priority Data

Jul. 1, 2008  (JP) .................................. 2008-172543

(51) Int. Cl.
*G03F 7/004*  (2006.01)
*G03F 7/033*  (2006.01)
*C08F 2/50*  (2006.01)
*C08F 12/24*  (2006.01)

(52) U.S. Cl. ....... 430/281.1; 522/79; 522/114; 522/121; 522/135; 522/142

(58) Field of Classification Search .................... 522/79, 522/114, 116, 117, 120, 121; 430/281.1
See application file for complete search history.

(56) References Cited

U.S. PATENT DOCUMENTS

| | | | |
|---|---|---|---|
| 6,010,824 A | 1/2000 | Komano et al. | |
| 6,120,973 A * | 9/2000 | Itano et al. | ................. 430/285.1 |
| 2001/0044075 A1 * | 11/2001 | Nishimura et al. | ........ 430/280.1 |
| 2007/0231747 A1 | 10/2007 | Onimaru et al. | |
| 2010/0196822 A1 * | 8/2010 | Sasaki et al. | ............... 430/280.1 |

FOREIGN PATENT DOCUMENTS

| | | |
|---|---|---|
| JP | 6-148885 | 5/1994 |
| JP | 11-038225 | 2/1999 |
| JP | 2006-259454 | 9/2006 |
| JP | 2006-285035 | 10/2006 |
| JP | 2007-226018 | 9/2007 |
| JP | 2007-293306 | 11/2007 |

OTHER PUBLICATIONS

International Search Report for International Application No. PCT/JP2009/060438, Jul. 7, 2009.

* cited by examiner

*Primary Examiner* — Susan W Berman

(74) *Attorney, Agent, or Firm* — Ditthavong Mori & Steiner, P.C.

(57) ABSTRACT

A negative-tone radiation-sensitive resin composition includes an alkali-soluble resin, a radically polymerizable compound, a radiation-sensitive radical initiator, and an organic solvent. The alkali-soluble resin includes a phenolic hydroxyl group. The radically polymerizable compound includes an ethylenically unsaturated double bond. The organic solvent includes an ethylene glycol organic solvent having a saturation vapor pressure of 3 mmHg or less at 20° C. and 1 atmosphere.

20 Claims, No Drawings

NEGATIVE RADIATION-SENSITIVE RESIN COMPOSITION

CROSS-REFERENCE TO RELATED APPLICATIONS

The present application is a continuation application of International Application No. PCT/JP2009/060438, filed Jun. 8, 2009, which claims priority to Japanese Patent Application No. 2008-172543, filed Jul. 1, 2008. The contents of these applications are incorporated herein by reference in their entirety.

BACKGROUND OF THE INVENTION

1. Field of the Invention

The present invention relates to a negative-tone radiation-sensitive resin composition.

2. Discussion of the Background

In recent years, the degree of integration and the number of layers of large-scale integration (LSI) used for electronic instruments (e.g., mobile phone) have rapidly increased. Therefore, a multi-pin mounting method has been required to mount LSI on an electronic instrument. For example, bare-chip mounting using tape automated bonding (TAB) or flip-chip bonding has attracted attention. In this case, it is necessary to accurately dispose a bump electrode (bump) (i.e., connection terminal) on LSI.

Various precision parts (e.g., bump) are produced by applying a radiation-sensitive resin composition to the surface of a workpiece to form a resin film, patterning the resin film by photolithography, and performing electroplating or the like using the patterned film as a mask (see Japanese Patent Application Publication (KOKAI) No. 2006-285035 and Japanese Patent Application Publication (KOKAI) No. 2007-293306, for example).

When producing various precision parts (e.g., bump) using photolithography, technology that forms resin films that differ in thickness is required. A radiation-sensitive resin composition is normally applied to the surface of a workpiece (e.g., substrate) by spin coating.

When forming a resin film having a given thickness by spin-coating a radiation-sensitive resin composition onto a substrate, it is necessary to strictly set the spin coating conditions (e.g., the rotation speed of the substrate, the rotation time of the substrate, and the concentration of the radiation-sensitive resin composition).

For example, when it is desired to form resin films that differ in thickness to a large extent, it is necessary to set the spin coating condition before and after applying the radiation-sensitive resin composition. Since the rotation speed of the substrate can be easily changed, resin films that differ in thickness have been normally obtained by changing the rotation speed of the substrate. It is also possible to form resin films that differ in thickness by changing the rotation time of the substrate.

In recent years, the size of a substrate has increased in order to improve yield. However, spin coating has a problem in that it is difficult to increase the range of rotation speed of the substrate as the size of the substrate increases. Therefore, it may be difficult to form resin films that differ in thickness to a large extent using an identical radiation-sensitive resin composition by changing the rotation speed of the substrate.

When forming resin films that differ in thickness using the radiation-sensitive resin composition disclosed in Japanese Patent Application Publication (KOKAI) No. 2006-285035 or Japanese Patent Application Publication (KOKAI) No. 2007-293306, the resulting resin films may have an almost equal thickness when fired after spin coating.

Specifically, it has been difficult to form resin films that differ in thickness to a large extent by spin-coating a related-art radiation-sensitive resin composition.

SUMMARY OF THE INVENTION

According to one aspect of the present invention, a negative-tone radiation-sensitive resin composition includes an alkali-soluble resin, a radically polymerizable compound, a radiation-sensitive radical initiator, and an organic solvent. The alkali-soluble resin includes a phenolic hydroxyl group. The radically polymerizable compound includes an ethylenically unsaturated double bond. The organic solvent includes an ethylene glycol organic solvent having a saturation vapor pressure of 3 mmHg or less at 20° C. and 1 atmosphere.

DESCRIPTION OF THE EMBODIMENTS

A negative-tone radiation-sensitive resin composition, a method of forming a radiation-sensitive resin film, a plating product, and a method of producing a plating product according to embodiments of the invention are described in detail below. An unexposed resin film formed using the above resin composition may be referred to as "radiation-sensitive resin film", and a layer obtained by patterning the resin film may be referred to as "resist pattern".

Negative-Tone Radiation-Sensitive Resin Composition

A negative-tone radiation-sensitive resin composition according to one embodiment of the invention includes (A) an alkali-soluble resin that includes a phenolic hydroxyl group (hereinafter may be referred to as "alkali-soluble resin (A)"), (B) a radically polymerizable compound that includes an ethylenically unsaturated double bond (hereinafter may be referred to as "radically polymerizable compound (B)"), (C) a radiation-sensitive radical initiator (hereinafter may be referred to as "radical initiator (C)"), and (D) an organic solvent that includes an ethylene glycol organic solvent having a saturation vapor pressure at 20° C. and 1 atmosphere within a given range (hereinafter may be referred to as "organic solvent (D)").

<Alkali-Soluble Resin (A)>

The alkali-soluble resin (A) includes a phenolic hydroxyl group. The term "alkali-soluble" used herein means that a resin is dissolved in an alkaline developer to such an extent that the desired development process can be achieved.

The alkali-soluble resin (A) preferably includes a structural unit shown by the following formula (1) (hereinafter may be referred to as "structural unit (1)"), and more preferably includes the structural unit (1) and a structural unit shown by the following formula (2) (hereinafter may be referred to as "structural unit (2)").

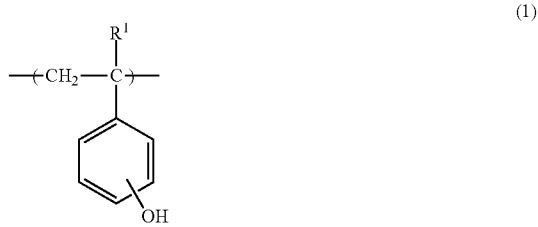

(1)

wherein $R^1$ represents a hydrogen atom or a methyl group.

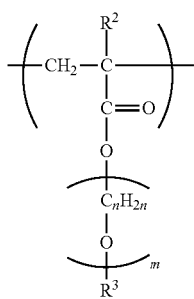

(2)

wherein $R^2$ represents a hydrogen atom or a methyl group, $R^3$ represents a linear hydrocarbon group having 6 to 12 carbon atoms, a cyclic hydrocarbon group having 6 to 12 carbon atoms, an aromatic hydrocarbon group having 6 to 12 carbon atoms, or a substituted hydrocarbon group obtained by substitution of at least one hydrogen atom of any of the above hydrocarbon groups with a hydrocarbon group (e.g., methyl group or ethyl group), m is an integer from 1 to 10, and n is an integer from 2 to 4.

Examples of the linear hydrocarbon group having 6 to 12 carbon atoms include a hexyl group, a heptyl group, an octyl group, a nonyl group, and the like.

Examples of the cyclic hydrocarbon group having 6 to 12 carbon atoms include cycloalkyl groups such as a cyclohexyl group, a cycloheptyl group, and a cyclooctyl group; groups derived from a bridged hydrocarbon such as adamantane, bicyclo[2.2.1]heptane, tetracyclo[6.2.1.1$^{3,6}$.0$^{2,7}$]dodecane, or tricyclo[5.2.1.0$^{2,6}$]decane; and the like.

Examples of the aromatic hydrocarbon group having 6 to 12 carbon atoms include a phenyl group, an o-tolyl group, an m-tolyl group, a p-tolyl group, a 4-t-butylphenyl group, a 1-naphthyl group, a benzyl group, and the like.

Swelling of the resist pattern during the plating step can be suppressed by utilizing the alkali-soluble resin (A) that includes the structural unit (1). Therefore, since the resist pattern is not removed from the substrate, a situation in which a plating solution enters the space (interface) between the substrate and the resist pattern can be prevented even when the plating step is performed for a long time. Moreover, excellent resolution can be obtained.

Since the alkali-soluble resin (A) that includes the structural unit (2) improves adhesion of the resist pattern to the substrate, a situation in which a plating solution enters the space (interface) between the substrate and the resist pattern can be prevented even when the plating step is performed for a long time.

The content of the structural unit (1) in the alkali-soluble resin (A) is normally 1 to 30 wt %, and preferably 10 to 20 wt %. If the content of the structural unit (1) is within the above range (i.e., a monomer that produces the structural unit (1) is used in such an amount), the molecular weight of the alkali-soluble resin (A) can be sufficiently increased. Moreover, swelling of the resist pattern during the plating step can be suppressed.

The content of the structural unit (2) in the alkali-soluble resin (A) is normally 1 to 40 wt %, and preferably 10 to 30 wt %. If the content of the structural unit (2) is within the above range (i.e., a monomer that produces the structural unit (2) is used in such an amount), the molecular weight of the alkali-soluble resin (A) can be sufficiently increased. Moreover, swelling of the resist pattern during the plating step can be suppressed.

The polystyrene-reduced weight average molecular weight (Mw) of the alkali-soluble resin (A) determined by gel permeation chromatography is normally 1000 to 100,000, preferably 2000 to 50,000, and more preferably from 3000 to 20,000.

<Monomer (1')>

The alkali-soluble resin (A) that includes the structural unit (1) may be produced by polymerizing raw material monomers including a hydroxyl group-containing aromatic vinyl compound (hereinafter may be referred to as "monomer (1')") such as o-hydroxystyrene, m-hydroxystyrene, p-hydroxystyrene, or p-isopropenylphenol, for example. These monomers (1') may be used either individually or in combination.

As the monomer (1'), p-hydroxystyrene and p-isopropenylphenol are preferable, and p-isopropenylphenol is more preferable, in order to obtain a negative-tone radiation-sensitive resin composition that can form a resist pattern that exhibits excellent resistance to long plating.

<Monomer (2')>

The alkali-soluble resin (A) that includes the structural unit (2) may be produced by polymerizing raw material monomers including a monomer shown by the following formula (2') (hereinafter may be referred to as "monomer (2')"), for example.

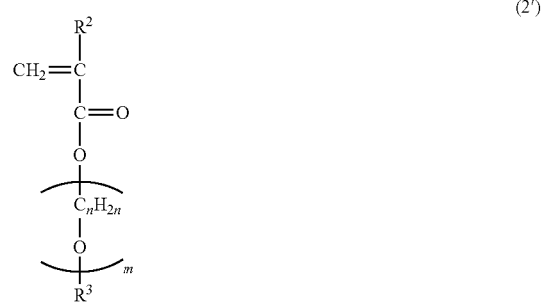

(2')

wherein $R^2$, $R^3$, m, and n are the same as defined for the formula (2).

Examples of the monomer (2')) include phenoxy diethylene glycol(meth)acrylate, phenoxy triethylene glycol(meth)acrylate, phenoxy tetraethylene glycol(meth)acrylate, phenoxy polyethylene glycol(meth)acrylate, phenoxy dipropylene glycol(meth)acrylate, phenoxy tripropylene glycol(meth)acrylate, phenoxy tetrapropylene glycol(meth)acrylate, lauroxy diethylene glycol(meth)acrylate, lauroxy triethylene glycol(meth)acrylate, lauroxy tetraethylene glycol(meth)acrylate, lauroxy dipropylene glycol(meth)acrylate, lauroxy tripropylene glycol(meth)acrylate, lauroxy tetrapropylene glycol(meth)acrylate, and the like. These monomers (2') may be used either individually or in combination.

As the monomer (2'), phenoxy diethylene glycol(meth)acrylate, phenoxy triethylene glycol(meth)acrylate, phenoxy tetraethylene glycol(meth)acrylate, phenoxy polyethylene glycol(meth)acrylate, phenoxy dipropylene glycol(meth)acrylate, phenoxy tripropylene glycol(meth)acrylate, and phenoxy tetrapropylene glycol(meth)acrylate are preferable, and phenoxy diethylene glycol acrylate, phenoxy triethylene glycol acrylate, phenoxy tetraethylene glycol acrylate, and phenoxy polyethylene glycol acrylate are more preferable, in order to obtain a negative-tone radiation-sensitive resin composition that can form a resist pattern that exhibits excellent adhesion to a substrate, heat resistance, and resistance to long plating.

<Monomer (I)>

The alkali-soluble resin (A) may further include a structural unit derived from a monomer (hereinafter may be referred to as "monomer (I)") that is copolymerizable with the monomer (1') or (2').

Examples of the monomer (I) include aromatic vinyl compounds such as styrene, a-methylstyrene, p-methylstyrene, and p-methoxystyrene; heteroatom-containing alicyclic vinyl compounds such as N-vinylpyrrolidone and N-vinylcaprolactam; cyano group-containing vinyl compounds such as acrylonitrile and methacrylonitrile; conjugated diolefins such as 1,3-butadiene and isoprene; carboxyl group-containing vinyl compounds such as acrylic acid and methacrylic acid; (meth)acrylates such as methyl(meth)acrylate, ethyl(meth)acrylate, n-propyl(meth)acrylate, n-butyl(meth)acrylate, 2-hydroxyethyl(meth)acrylate, 2-hydroxypropyl(meth)acrylate, polyethylene glycol mono(meth)acrylate, polypropylene glycol mono(meth)acrylate, glycerol mono(meth)acrylate, phenyl(meth)acrylate, benzyl(meth)acrylate, cyclohexyl(meth)acrylate, isobornyl(meth)acrylate, and tricyclodecanyl(meth)acrylate; p-hydroxyphenyl(meth)acrylamide; and the like. These monomers (I) may be used either individually or in combination.

As the monomer (I), styrene, acrylic acid, methacrylic acid, methyl(meth)acrylate, ethyl(meth)acrylate, n-butyl(meth)acrylate, tricyclodecanyl(meth)acrylate, benzyl(meth)acrylate, isobornyl(meth)acrylate, p-hydroxyphenyl(meth)acrylamide, and the like are preferable.

The alkali-soluble resin (A) may be produced by radical polymerization, for example. Examples of the polymerization method include emulsion polymerization, suspension polymerization, solution polymerization, bulk polymerization, and the like. It is preferable to use solution polymerization using a polymerization solvent.

<Polymerization Initiator>

A polymerization initiator used when producing the alkali-soluble resin (A) may be a radical initiator. Examples of the radical initiator include azo compounds such as 2,2'-azobisisobutylonitrile, 2,2'-azobis-(2,4-dimethylvaleronitrile), 2,2'-azobis-(4-methoxy-2,4-dimethylvaleronitrile), 2,2'-azobis(2-methylbutyronitrile), 1,1'-azobis-(cyclohexane-1-carbonitrile), and dimethyl-2,2'-azobis(2-methyl propionate); organic peroxides such as benzoyl peroxide, lauroyl peroxide, t-butyl peroxypivalate, and 1,1'-bis-(t-butylperoxy)cyclohexane; hydrogen peroxide; and the like.

When using an organic peroxide as the radical initiator, an inorganic reducing agent (e.g., iron(II) hydroxide or sodium sulfite) or an organic reducing agent (e.g., alcohol or polyamine) may be used in combination with the organic peroxide (i.e., redox initiator).

<Polymerization Solvent>

The polymerization solvent used when producing the alkali-soluble resin (A) by solution polymerization is not particularly limited insofar as the polymerization solvent does not react with the monomer component and dissolves the alkali-soluble resin (A).

Examples of the polymerization solvent include alcohols such as methanol, ethanol, ethylene glycol, diethylene glycol, and propylene glycol; cyclic ethers such as tetrahydrofuran and dioxane; alkyl ethers of a polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of a polyhydric alcohol such as ethylene glycol monoethyl ether acetate, diethylene glycol monoethyl ether acetate, propylene glycol monomethyl ether acetate, and propylene glycol monoethyl ether acetate; aromatic hydrocarbons such as toluene and xylene; ketones such as acetone, methyl ethyl ketone, methyl isobutyl ketone, cyclohexanone, and 4-hydroxy-4-methyl-2-pentanone; and esters such as ethyl acetate, butyl acetate, ethyl ethoxyacetate, ethyl hydroxyacetate, ethyl-2-hydroxypropionate, ethyl 2-hydroxy-2-methylpropionate, methyl 2-hydroxy-3-methylbutanoate, methyl 3-methoxypropionate, ethyl 3-methoxypropionate, methyl 3-ethoxypropionate, ethyl 3-ethoxypropionate, and ethyl lactate.

Among these, cyclic ethers, alkyl ethers of a polyhydric alcohol, alkyl ether acetates of a polyhydric alcohol, ketones, esters, and the like are preferable.

<Radically Polymerizable Compound (B)>

The radically polymerizable compound (B) is a compound that includes at least one ethylenically unsaturated double bond in the molecule, and is preferably liquid or solid at room temperature.

A (meth)acrylate compound that includes a (meth)acryloyl group or a compound that includes a vinyl group is preferably used as the radically polymerizable compound (B). The (meth)acrylate compound is classified as a monofunctional (meth)acrylate compound or a polyfunctional (meth)acrylate compound. Any of these compounds may be used as the radically polymerizable compound (B).

Examples of the monofunctional (meth)acrylate compound include 2-hydroxyethyl(meth)acrylate, 2-hydroxypropyl(meth)acrylate, 2-hydroxybutyl(meth)acrylate, methyl(meth)acrylate, ethyl(meth)acrylate, propyl(meth)acrylate, isopropyl(meth)acrylate, butyl(meth)acrylate, isobutyl(meth)acrylate, tert-butyl(meth)acrylate, pentyl(meth)acrylate, isoamyl(meth)acrylate, hexyl(meth)acrylate, heptyl(meth)acrylate, octyl(meth)acrylate, isooctyl(meth)acrylate, 2-ethylhexyl(meth)acrylate, nonyl(meth)acrylate, decyl(meth)acrylate, isodecyl(meth)acrylate, undecyl(meth)acrylate, dodecylamyl(meth)acrylate, lauryl(meth)acrylate, octadecyl(meth)acrylate, stearyl(meth)acrylate, tetrahydrofurfuryl(meth)acrylate, benzyl(meth)acrylate, phenoxyethyl(meth)acrylate, ethoxyethyl(meth)acrylate, butoxyethyl(meth)acrylate, glycerol(meth)acrylate, ethylene glycol monomethyl ether(meth)acrylate, ethylene glycol monoethyl ether(meth)acrylate, polyethylene glycol mono(meth)acrylate, polypropylene glycol mono(meth)acrylate, methoxy ethylene glycol(meth)acrylate, ethoxydiethylene glycol(meth)acrylate, methoxy polyethylene glycol(meth)acrylate, methoxy polypropylene glycol(meth)acrylate, phenoxy polyethylene glycol(meth)acrylate, phenoxy polypropylene glycol(meth)acrylate, tricyclo[$5.2.1.0^{2,6}$]decadienyl(meth)acrylate, tricyclo[$5.2.1.0^{2,6}$]decanyl(meth)acrylate, tricyclo[$5.2.1.0^{2,6}$]decenyl(meth)acrylate, isobornyl(meth)acrylate, bornyl(meth)acrylate, cyclohexyl(meth)acrylate, acrylamide, methacrylamide, diacetone(meth)acrylamide, isobutoxymethyl(meth)acrylamide, N,N-dimethyl(meth)acrylamide, tert-octyl(meth)acrylamide, dimethylaminoethyl(meth)acrylate, diethylaminoethyl(meth)acrylate, 7-amino-3,7-dimethyloctyl(meth)acrylate, and the like.

Examples of the polyfunctional (meth)acrylate compound include trimethylolpropane di(meth)acrylate, trimethylolpropane tri(meth)acrylate, trimethylolpropane PO (propylene oxide)-modified tri(meth)acrylate, tetramethylolpropane tetra(meth)acrylate, ethylene glycol di(meth)acrylate, tetraethylene glycol di(meth)acrylate, polyethylene glycol di(meth)acrylate, 1,4-butanediol di(meth)acrylate, 1,6-hexanediol di(meth)acrylate, propylene glycol di(meth)acrylate, butylene glycol di(meth)acrylate, neopentyl glycol di(meth)

acrylate, tris(2-hydroxyethyl)isocyanurate di(meth)acrylate, tris(2-hydroxyethyl)isocyanurate tri(meth)acrylate, tricyclodecanedimethanol di(meth)acrylate, epoxy(meth)acrylate obtained by adding (meth)acrylic acid to bisphenol A diglycidyl ether, bisphenol A di(meth)acryloyloxy ethyl ether, bisphenol A di(meth)acryloyloxy methyl ethyl ether, bisphenol A di(meth)acryloyloxy ethyloxy ethyl ether, pentaerythritol tri(meth)acrylate, pentaerythritol tetra(meth)acrylate, dipentaerythritol penta(meth)acrylate, dipentaerythritol hexa(meth)acrylate, (tri- or higher functional) polyester(meth)acrylate, and the like.

A commercially available compound may be used as the radically polymerizable compound (B). Examples of a commercially available compound that may be used as the radically polymerizable compound (B) include Aronix M-210, Aronix M-309, Aronix M-310, Aronix M-320, Aronix M-400, Aronix M-7100, Aronix M-8030, Aronix M-8060, Aronix M-8100, Aronix M-9050, Aronix M-240, Aronix M-245, Aronix M-6100, Aronix M-6200, Aronix M-6250, Aronix M-6300, Aronix M-6400, Aronix M-6500 (manufactured by Toagosei Co., Ltd.), KAYARAD R-551, KAYARAD R-712, KAYARAD TMPTA, KAYARAD HDDA, KAYARAD TPGDA, KAYARAD PEG400DA, KAYARAD MANDA, KAYARAD HX-220, KAYARAD HX-620, KAYARAD R-604, KAYARAD DPCA-20, DPCA-30, KAYARAD DPCA-60, KAYARAD DPCA-120 (manufactured by Nippon Kayaku Co., Ltd.), Viscoat #295, Viscoat #300, Viscoat #260, Viscoat #312, Viscoat #335HP, Viscoat #360, Viscoat #GPT, Viscoat #3PA, Viscoat #400 (manufactured by Osaka Organic Chemical Industry Co., Ltd.), and the like.

These radically polymerizable compounds (B) may be used either individually or in combination.

The radically polymerizable compound (B) is normally used in an amount of 30 to 80 parts by weight, and preferably 40 to 70 parts by weight, based on 100 parts by weight of the alkali-soluble resin (A). If the amount of the radically polymerizable compound (B) is within the above range, the radically polymerizable compound (B) exhibits excellent mutual solubility with the alkali-soluble resin (A), so that the storage stability of a coating liquid of the negative-tone radiation-sensitive resin composition is improved. Moreover, the radiation-sensitive resin film exhibits excellent exposure sensitivity.

<Radical Initiator (C)>

The radical initiator (C) is a compound that generates radicals upon exposure to radiation so that the radically polymerizable compound (B) undergoes radical polymerization.

The term "radiation" refers to ultraviolet rays, visible rays, deep ultraviolet rays, X-rays, electron beams, and the like. A mercury lamp is normally used as a radiation source for curing a radiation-sensitive resin. When curing a radiation-sensitive resin, an i-line (wavelength: 365 nm) or an h-line (wavelength: 405 nm) in the emission spectrum of a mercury lamp is normally used.

Since the i-line has high energy as compared with the h-line, the radiation-sensitive resin can be advantageously cured without being hindered by oxygen. However, since the i-line has a short wavelength, the i-line is easily absorbed by a radical initiator. Therefore, when using the i-line for curing a thick radiation-sensitive resin film, a sufficient energy may not reach the bottom area of the radiation-sensitive resin film, so that the desired latent image pattern may not be formed in the resin film. For example, the patterned resist pattern may have a non-rectangular cross-sectional shape, or the bottom area of the resist pattern may narrower than the surface area of the resist pattern (i.e., the resist pattern may have a trapezoidal cross-sectional shape).

Since the h-line has low energy as compared with the i-line, the radiation-sensitive resin may not be sufficiently cured, and curing may be hindered by oxygen, so that the residual film rate after patterning may significantly decrease.

However, since the wavelength of the h-line is higher than that of the i-line, a high transmittance is obtained. Therefore, when using the h-line for curing a thick radiation-sensitive resin film, a sufficient amount of energy easily reaches the bottom area of the radiation-sensitive resin film, and the resist pattern has a rectangular cross-sectional shape (i.e., the desired pattern is obtained).

The i-line and the h-line have the above properties. Therefore, in order to sufficiently cure the surface area and the bottom area of the radiation-sensitive resin film to obtain the desired accurate pattern, it is preferable that the negative-tone radiation-sensitive resin composition according to one embodiment of the invention satisfy the following requirements (1) and (2).

Specifically, when forming an uncured radiation-sensitive resin film having a dry thickness of 70 μm using the negative-tone radiation-sensitive resin composition according to one embodiment of the invention, (1) the resin film must have an i-line (wavelength: 365 nm) transmittance of preferably 10% or more, and more preferably 12 to 30%, and (2) the resin film must have an h-line (wavelength: 405 nm) transmittance of preferably 60% or more, and more preferably 65 to 80%.

If the composition satisfies the above requirements, when forming a radiation-sensitive resin film having a thickness of 5 to 200 μm on a substrate, and applying the i-line and the h-line, the surface area and the bottom area of the radiation-sensitive resin film can be sufficiently cured to obtain the desired accurate pattern.

Specifically, since attenuation of light that enters from the surface of the radiation-sensitive resin film toward the inside of the radiation-sensitive resin film can be suppressed by improving the i-line transmittance and the h-line transmittance, the entire radiation-sensitive resin film can be uniformly cured, so that a resist pattern having an almost rectangular cross-sectional shape can be obtained. This makes it possible to accurately form a linear bump by electroplating, for example.

The radiation transmittance may be measured by the following method, for example.

Specifically, 65 parts by weight of the negative-tone radiation-sensitive resin composition including given amounts of the alkali-soluble resin (A), the radically polymerizable compound (B), the radical initiator (C), and the organic solvent (D) is mixed with 35 parts by weight of diethylene glycol ethyl methyl ether to prepare a solution.

The solution is spin-coated onto a quartz substrate (thickness: 1 mm) to form a film. The film is baked at 120° C. for 5 minutes on a hot plate to remove the solvent. A radiation-sensitive resin film is thus formed. The rotational speed during spin coating is controlled so that the radiation-sensitive resin film obtained by baking has a thickness of 70 μm.

The transmittance (wavelength: 300 to 500 nm) of the radiation-sensitive resin film formed on the quartz substrate is measured using a spectrophotometer (e.g., HITACHI Spectrophotometer U-2010) (reference: quartz substrate on which the resin film is not formed).

The negative-tone radiation-sensitive resin composition according to one embodiment of the invention preferably satisfies the following requirements (3) and (4) when forming an uncured radiation-sensitive resin film having a dry thickness of 70 μm and converting the absorbance into an absorption coefficient.

(3) The absorption coefficient for radiation having a wavelength of 365 nm is 15,000 m$^{-1}$ or less.
(4) The absorption coefficient for radiation having a wavelength of 405 nm is 4000 m$^{-1}$ or less.

The absorption coefficient ε is calculated by applying the measured transmittance to ε=log(I$_0$/I)/L (where, ε is the absorption coefficient (m$^{-1}$), I is the intensity (cd) of light that that has passed through the radiation-sensitive resin film, I$_0$ is the intensity (cd) of light that that has not passed through the radiation-sensitive resin film, and L is the dry thickness (m) of the radiation-sensitive resin film).

The radical initiator (C) is normally used in an amount of 1 to 40 parts by weight, preferably 5 to 30 parts by weight, and more preferably 10 to 20 parts by weight, based on 100 parts by weight of the alkali-soluble resin (A). If the amount of the radical initiator (C) is within the above range, a composition that satisfies the requirements (1) to (4) can be easily obtained.

Examples of the radical initiator (C) include 2,2-dimethoxy-1,2-diphenylethan-1-one, 4,4'-bis(diethylamino)benzophenone, 2-benzyl-2-dimethylamino-1-(4-morpholinophenyl)-butan-1-one, 2-methyl-1-[4-(methylthio)phenyl]-2-morpholinopropan-1-one, a biimidazole compound shown by the following formula (3), and the like. Examples of a commercially available product of the radical initiator (C) include Irgacure 369 (manufactured by Ciba Specialty Chemicals), Irgacure 907 (manufactured by Ciba Specialty Chemicals), and the like. Among these, it is preferable to use the biimidazole compound since a composition that satisfies the requirements (1) to (4) can be easily obtained.

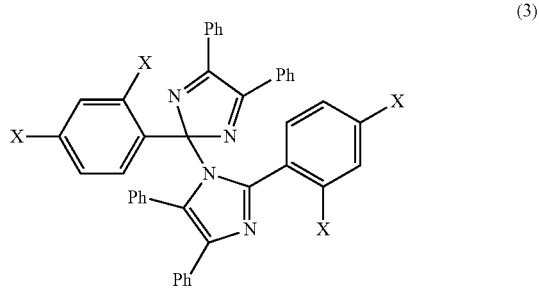

(3)

wherein X individually represent a hydrogen atom, a methyl group, or a chlorine atom, and Ph represents a phenyl group.

Examples of the biimidazole compound include 2,2'-bis(2,4-dichlorophenyl)-4,5,4',5'-tetraphenyl-1,2'-biimidazole, 2,2'-bis(2-chlorophenyl)-4,5,4',5'-tetraphenyl-1,2'-biimidazole, 2,2'-bis(2,4-dichlorophenyl)-4,5,4',5'-tetraphenyl-1,2'-biimidazole, 2,2'-bis(2,4-dimethylphenyl)-4,5,4',5'-tetraphenyl-1,2'-biimidazole, 2,2'-bis(2-methylphenyl)-4,5,4',5'-tetraphenyl-1,2'-biimidazole, 2,2'-diphenyl-4,5,4',5'-tetraphenyl-1,2'-biimidazole, and the like. These biimidazole compounds may be used either individually or in combination.

The biimidazole compound is normally used in an amount of 1 to 30 parts by weight, preferably 1 to 20 parts by weight, and more preferably 1 to 10 parts by weight, based on 100 parts by weight of the alkali-soluble resin (A). If the amount of the radically biimidazole compound is within the above range, the radiation-sensitive resin film exhibits excellent exposure sensitivity, and radiation reaches the inside of the resin film. Therefore, a straight (linear) pattern can be formed.

<Organic Solvent (D)>

The organic solvent (D) includes an ethylene glycol organic solvent having a saturation vapor pressure at 20° C. and 1 atmosphere (hereinafter may be simply referred to as "saturation vapor pressure") within a given range. The term "ethylene glycol organic solvent" used herein refers to an organic solvent that includes the structural unit shown by the following formula (4).

(4)

The organic solvent that includes the structural unit shown by the formula (4) can advantageously dissolve the above components (e.g., radical initiator (C)). Moreover, the range of thickness of the radiation-sensitive resin film formed by spin coating can be sufficiently increased.

The saturation vapor pressure of the ethylene glycol organic solvent is 3 mmHg or less, preferably 1 mmHg or less, and more preferably 0.01 to 1.0 mmHg.

If the saturation vapor pressure of the ethylene glycol organic solvent is within the above range, the range of thickness of the radiation-sensitive resin film formed by spin coating can be sufficiently increased. It is necessary to increase the rotation time and the rotation speed of the substrate when forming a thin radiation-sensitive resin film. If the saturation vapor pressure of the ethylene glycol organic solvent is within the above range, a resin film having the desired thickness can be obtained by adjusting these conditions.

If the saturation vapor pressure of the ethylene glycol organic solvent exceeds the above range, it may be difficult to sufficiently increase the range of thickness of the radiation-sensitive resin film formed by spin coating. Moreover, it may be difficult to form a thin resin film when the rotation time of the substrate exceeds a given time.

Examples of the ethylene glycol organic solvent include diethylene glycol monoalkyl ethers, diethylene glycol dialkyl ethers, diethylene glycol monoalkyl ether acetates, ethylene glycol monoalkyl ether acetates, and the like. These ethylene glycol organic solvents may be used either individually or in combination. Among these, diethylene glycol dialkyl ethers and diethylene glycol monoalkyl ether acetates are preferable. These solvents may be used either individually or in combination.

Examples of diethylene glycol monoalkyl ethers include diethylene glycol monomethyl ether (saturation vapor pressure: 0.23 mmHg), diethylene glycol monoethyl ether (saturation vapor pressure: 0.13 mmHg), and the like. These diethylene glycol monoalkyl ethers may be used either individually or in combination.

Examples of diethylene glycol dialkyl ethers include diethylene glycol dimethyl ether (saturation vapor pressure: 3.0 mmHg), diethylene glycol ethyl methyl ether (saturation vapor pressure: 0.94 mmHg), diethylene glycol diethyl ether (saturation vapor pressure: 0.38 mmHg), and the like. These diethylene glycol dialkyl ethers may be used either individually or in combination.

Examples of diethylene glycol monoalkyl ether acetates include diethylene glycol monoethyl ether acetate (saturation vapor pressure: 0.05 mmHg), diethylene glycol monobutyl ether acetate (saturation vapor pressure: 0.01 mmHg), and the like. These diethylene glycol monoalkyl ether acetates may be used either individually or in combination.

Examples of ethylene glycol monomethyl ether acetates include ethylene glycol monoalkyl ether acetate (saturation vapor pressure: 1.09 mmHg), ethylene glycol monobutyl ether acetate (saturation vapor pressure: 0.3 mmHg), and the like. These ethylene glycol monoalkyl ether acetates may be used either individually or in combination.

The boiling point (at 1 atmosphere) of the ethylene glycol organic solvent is preferably 150 to 250° C., and more preferably 170 to 230° C. If the boiling point of the ethylene glycol organic solvent is within the above range, the in-plane uniformity and the thickness range can be improved when forming a radiation-sensitive resin film by spin coating.

An additional organic solvent may be used as the organic solvent (D) in addition to the ethylene glycol organic solvent in order to sufficiently dissolve each component.

Examples of the additional organic solvent include alcohols such as methanol, ethanol, and propylene glycol; cyclic ethers such as tetrahydrofuran and dioxane; propylene glycol monoalkyl ethers such as propylene glycol methyl ether and propylene glycol monoethyl ether; propylene glycol monoalkyl ether acetates such as propylene glycol monomethyl ether acetate and propylene glycol monoethyl ether acetate; aromatic hydrocarbons such as toluene and xylene; ketones such as acetone, methyl ethyl ketone, methyl isobutyl ketone, cyclohexanone, and 4-hydroxy-4-methyl-2-pentanone; esters such as ethyl acetate, butyl acetate, ethyl ethoxyacetate, ethyl hydroxyacetate, ethyl-2-hydroxypropionate, ethyl 2-hydroxy-2-methylpropionate, methyl 2-hydroxy-3-methylbutanoate, methyl 3-methoxypropionate, ethyl 3-methoxypropionate, ethyl 3-ethoxypropionate, methyl 3-ethoxypropionate, and ethyl lactate; N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, γ-butyrolactone, ethylene carbonate, propylene carbonate, phenyl cellosolve acetate; and the like.

The ethylene glycol organic solvent is preferably used in an amount of 50 wt % or more, and more preferably 80 wt % or more, based on the total amount (=100 wt %) of the organic solvent (D). It is possible to form resin films that differ in thickness to a large extent by utilizing the ethylene glycol organic solvent as the organic solvent (D) within the above range.

The amount of the organic solvent (D) may be appropriately selected depending on the application of the negative-tone radiation-sensitive resin composition and the like. For example, when forming a radiation-sensitive resin film having a thickness of 5 to 100 μm for producing a plating product (e.g., bump), the organic solvent (D) is normally used in an amount of 50 parts by weight or more, preferably 60 to 300 parts by weight, and more preferably 80 to 200 parts by weight, based on 100 parts by weight of the alkali-soluble resin (A).

<Additional Component>

The negative-tone radiation-sensitive resin composition according to one embodiment of the invention may optionally further include a thermal polymerization inhibitor, a surfactant, an adhesion improver, and the like.

<Thermal Polymerization Inhibitor>

Examples of the thermal polymerization inhibitor include pyrogallol, benzoquinone, hydroquinone, methylhydroquinone, Methylene Blue, tert-butylcatechol, monobenzyl ether, amylquinone, amyloxyhydroquinone, phenol, n-butylphenol, hydroquinone monopropyl ether, 4,4'-(1-methylethylidene)bis(2-methylphenol), 4,4'-(1-methylethylidene)bis(2,6-dimethylphenol), 4,4'-[1-(4-(1-(4-hydroxyphenyl)-1-methylethyl)phenyl)ethylidene]bisphenol, 4,4',4''-ethylidenetris(2-methyl phenol), 4,4',4''-ethylidenetrisphenol, 1,1,3-tris(2,5-dimethyl-4-hydroxyphenyl)-3-phenylpropane, and the like.

The thermal polymerization inhibitor is preferably used in an amount of 5 parts by weight or less based on 100 parts by weight of the alkali-soluble resin (A).

<Surfactant>

The negative-tone radiation-sensitive resin composition according to one embodiment of the invention may include a surfactant in order to increase the applicability, defoamability, leveling properties, and the like.

A commercially available compound may be used as the surfactant. Specific examples of a commercially available surfactant include NBX-15, FTX-204D, FTX-208D, FTX-212D, FTX-216D, FTX-218, FTX-220D, and FTX-222D (manufactured by NEOS Co., Ltd.), BM-1000, BM-1100 (manufactured by BM Chemie), Megafac F142D, F172, F173, F183 (manufactured by DIC Corporation), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Dow Corning Toray Silicone Co., Ltd.), and the like. Among these, FTX-216D, FTX-218, and FTX-220D are preferable.

The surfactant is preferably used in an amount of 5 parts by weight or less based on 100 parts by weight of the alkali-soluble resin (A).

<Adhesion Improver>

The negative-tone radiation-sensitive resin composition according to one embodiment of the invention may include an adhesion improver in order to improve adhesion of the radiation-sensitive resin film to the substrate. A functional silane coupling agent is preferable as the adhesion improver. The term "functional silane coupling agent" used herein refers to a silane coupling agent that includes a reactive substituent (e.g., carboxyl group, methacryloyl group, vinyl group, isocyanate group, or epoxy group).

Examples of the functional silane coupling agent include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane, and the like.

The adhesion improver is preferably used in an amount of 20 parts by weight or less based on 100 parts by weight of the alkali-soluble resin (A).

<Other Additives>

The negative-tone radiation-sensitive resin composition according to one embodiment of the invention may include a carboxylic acid or a derivative thereof in order to finely adjust the solubility of the radiation-sensitive resin film in an alkaline developer. The negative-tone radiation-sensitive resin composition may also include a filler, a coloring agent, a viscosity controller, and the like.

Examples of the carboxylic acid and a derivative thereof include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polycarboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, and 1,2,5,8-naphthalenetetracarboxylic acid; carboxylic anhydrides such as itaconic anhydride, succinic anhydride, citraconic anhydride, dodecenylsuccinic anhydride, tricarbanil anhydride, maleic anhydride, hexahydrophthalic anhydride, methyltetrahydrophthalic anhydride, hymic anhydride, 1,2,3,4-butanetetracarboxylic dianhydride, cyclopentanetetracarboxylic dianhydride, phthalic anhydride, pyromellitic anhydride, trimellitic anhydride, benzophenonetetracarboxylic anhydride, ethylene glycol bis(anhydrous trimellitate), and glycerol tris(anhydrous trimellitate); and the like.

Examples of the filler include silica, alumina, talc, bentonite, zirconium silicate, glass powder, and the like.

Examples of the coloring agent include extenders such as alumina white, clay, barium carbonate, and barium sulfate; inorganic pigments such as zinc oxide, white lead, chrome yellow, minium, ultramarine, iron blue, titanium oxide, zinc chromate, redironoxide, and carbon black; organic pigments such as brilliant carmin 6B, permanent red 6B, permanent red R, benzidine yellow, phthalocyanine blue, and phthalocyanine green; basic dyes such as magenta and rhodamine; direct dyes such as direct scarlet and direct orange; acidic dyes such as roccelline and metanil yellow; and the like.

Examples of the viscosity controller include bentonite, silica gel, aluminum powder, and the like.

The viscosity controller may be used as the filler or the coloring agent, the filler may be used as the coloring agent or the viscosity controller, and the coloring agent may be used as the filler or the viscosity controller.

These additives are preferably used in an amount of 50 parts by weight or less based on 100 parts by weight of the alkali-soluble resin (A), the radically polymerizable compound (B), and the radical initiator (C) in total.

The viscosity of the negative-tone radiation-sensitive resin composition according to one embodiment of the invention may be appropriately adjusted by adjusting the amount of each component (particularly the organic solvent (D), the viscosity controller, and the like). The viscosity of the negative-tone radiation-sensitive resin composition is normally 50 to 10,000 cP, and preferably 100 to 5000 cP.

<Application of Negative-Tone Radiation-Sensitive Resin Composition>

The negative-tone radiation-sensitive resin composition according to one embodiment of the invention makes it possible to form radiation-sensitive resin films that differ in thickness to a large extent by changing the spin coating conditions (e.g., the rotation speed and the rotation time of the substrate).

Plating products (e.g., bumps or lines) that differ in height can be accurately produced by utilizing a resist pattern formed using the negative-tone radiation-sensitive resin composition as a mold.

<Method of Forming Radiation-Sensitive Resin Film>

A radiation-sensitive resin film may be formed on a substrate by spin coating using the negative-tone radiation-sensitive resin composition according to one embodiment of the invention. Radiation-sensitive resin films that have an identical composition and differ in thickness can be formed using the negative-tone radiation-sensitive resin composition according to one embodiment of the invention.

When forming a resin film by spin coating using a resin composition, the thickness of the resin film can be controlled without changing the composition of the resin composition by controlling the rotational speed during spin coating. When using the negative-tone radiation-sensitive resin composition according to one embodiment of the invention, the rotation speed during spin coating is normally 800 to 3000 rpm, and preferably 800 to 2000 rpm, and the rotation time is normally 1 to 300 seconds, and preferably 5 to 200 seconds.

When reducing the rotation time (spin coating time), the resulting resin film has a large thickness, but has poor properties. However, a radiation-sensitive resin film having excellent properties can be obtained using the negative-tone radiation-sensitive resin composition according to one embodiment of the invention, even if the rotation time (spin coating time) is reduced. For example, when forming a thick radiation-sensitive resin film (i.e., the dry thickness is 10 µm or more, and preferably 40 µm or more) using the negative-tone radiation-sensitive resin composition according to one embodiment of the invention, the rotation speed is normally set to 1000 to 3000 rpm, and the rotation time is normally set to 1 to 300 seconds, and preferably 5 to 200 seconds.

After spin-coating the negative-tone radiation-sensitive resin composition, the resulting film is dried at 50 to 250° C. for about 1 to 30 minutes, for example.

<Plating Product>

A plating product according to one embodiment of the invention is produced by performing a plating process (e.g., electroplating) using a resist pattern formed using the above negative-tone radiation-sensitive resin composition as a mold.

<Method of Producing Plating Product>

The plating product may be produced by (1) forming a radiation-sensitive resin film on a substrate (e.g., wafer) having a barrier metal layer using the above negative-tone radiation-sensitive resin composition (resin film-forming step), (2) exposing and developing the resin film to form a resist pattern (exposure/development step), (3) performing a plating process (e.g., depositing an electrode material by electroplating) using the resist pattern as a mold (plating step), and (4) removing the resist pattern, and optionally removing the barrier metal by etching (removal step).

(1) Resin Film-Forming Step

The radiation-sensitive resin film formed on the substrate (e.g., wafer) in the resin film-forming step may be obtained by applying the negative-tone radiation-sensitive resin composition according to one embodiment of the invention to the substrate by spin coating, and drying the resulting film. In the resin film-forming step, the spin coating conditions described in connection with the section entitled "<Method of forming radiation-sensitive resin film>" may be used, for example.

(2) Exposure/Development Step

An alkaline developer used to develop the exposed radiation-sensitive resin film is a solution prepared by dissolving at least one alkaline compound in water or the like. The radiation-sensitive resin film developed using the alkaline developer is normally washed with water.

(3) Plating Step

The substrate (e.g., wafer) obtained by the exposure/development step is immersed in an electroplating solution, and the plating process is performed at a given current value for a given time that are set so that the desired plating thickness is obtained.

(4) Removal Step

In the removal step, the resist pattern is removed from the substrate (e.g., wafer) subjected to the plating process by immersing the substrate in a stripper at 50 to 80° C. for 1 to 30 minutes with stirring. After the removal step, the barrier metal is optionally removed by dry etching or wet etching to obtain a plating product.

Examples of the stripper include an aqueous solution of sodium hydroxide or sodium carbonate, a mixed solution of a quaternary ammonium salt, dimethyl sulfoxide, and water, and the like.

Since radiation-sensitive resin films that differ in thickness to a large extent can be formed using the negative-tone radiation-sensitive resin composition according to one embodiment of the invention, plating products that differ in thickness can be produced.

The embodiments of the invention are further described below by way of examples. Note that the embodiments of the invention are not limited to the following examples. The unit "parts" refers to "parts by weight".

Synthesis Example 1

A flask equipped with a dry ice/methanol reflux condenser and containing nitrogen was charged with 5.0 g of 2,2'-azobisisobutyronitrile (polymerization initiator) and 90 g of diethylene glycol ethyl methyl ether (polymerization solvent). The mixture was stirred until the polymerization initiator was dissolved.

After the addition of 11 g of methacrylic acid, 15 g of p-isopropenylphenol, 15 g of tricyclo[$5.2.1.0^{2,6}$]decanyl methacrylate, 39 g of isobornyl acrylate, and 20 g of phenoxy polyethylene glycol acrylate ("P-200A" manufactured by Kyoeisha Chemical Co., Ltd.), the mixture was gently stirred, and heated to 80° C. The monomers were then polymerized at 80° C. for 6 hours.

After completion of polymerization, the reaction product was added dropwise to a large quantity of cyclohexane to effect coagulation. The coagulated product was washed with water, and dissolved in an equal weight of tetrahydrofuran. The resulting solution was added dropwise to a large quantity of cyclohexane to effect coagulation. The above operation was performed three times in total. The resulting coagulated product was dried at 40° C. for 48 hours under vacuum to obtain an alkali-soluble resin A1.

Example 1

Preparation of Negative-Tone Radiation-Sensitive Resin Composition 100 parts of the alkali-soluble resin A1 (alkali-soluble resin (A)), 60 parts of polyester acrylate (tri- or higher functional) ("Aronix M-8060" manufactured by Toagosei Co., Ltd.) (radically polymerizable compound (B)), 10 parts of trimethylolpropane PO-modified (n=2) triacylate ("Aronix M-320" manufactured by Toagosei Co., Ltd.) (radically polymerizable compound (B)), 10 parts of 2-methyl-1-[4-(methylthio)phenyl]-2-morpholinopropan-1-one ("Irgacure 907" manufactured by Ciba Specialty Chemicals) (radical initiator (C)), 4 parts of 2,2'-bis(2-chlorophenyl)-4,5,4',5'-tetraphenyl-1,2'-biimidazole (radical initiator (C)), 0.2 parts of 4,4'-bis(diethylamino)benzophenone (radical initiator (C)), 102 parts of diethylene glycol ethyl methyl ether (organic solvent (D)), and 0.3 parts of NBX-15 (manufactured by NEOS Co., Ltd.) (surfactant) were mixed and stirred to obtain a homogenous solution. The solution was filtered through a capsule filter (pore size: 10 μm) to obtain a negative-tone radiation-sensitive resin composition (1).

(Formation of Radiation-Sensitive Resin Film)

The negative-tone radiation-sensitive resin composition (1) was spin-coated onto a silicon wafer substrate (diameter: 4 inches) using a spin coater, and heated at 110° C. for 5 minutes on a hot plate to obtain a radiation-sensitive resin film. The resulting radiation-sensitive resin film was evaluated as follows (evaluations 1 and 2). The evaluation results are shown in Table 2.

Note that the negative-tone radiation-sensitive resin composition (1) was spin-coated at 300 rpm for 10 seconds (pre-rotation), and then spin-coated at 1200 rpm (thick film-forming rotation speed) or 2400 rpm (thin film-forming rotation speed) for 10, 20, 30, 40, 60, or 120 seconds (main rotation).

(Evaluation 1)

The thickness of the radiation-sensitive resin film was measured using a spectroscopic ellipsometer ("FE3000" manufactured by Otsuka Electronics Co., Ltd.), and the difference between the maximum thickness and the minimum thickness of the resin films formed under the above conditions was calculated.

(Evaluation 2)

The properties of the radiation-sensitive resin film formed on the silicon wafer substrate were observed with the naked eye. A case where the resin film was uniformly formed on the substrate was evaluated as "AA", a case where a non-uniform resin film was formed on part of the substrate was evaluated as "BB", and a case where a nonuniform resin film was formed on most of the substrate was evaluated as "CC".

Examples 2 and 3 and Comparative Examples 1 to 3

Negative-tone radiation-sensitive resin compositions (2) to (6) were obtained in the same manner as in Example 1, except for using the components shown in Table 1. Radiation-sensitive resin films were formed in the same manner as in Example 1, except for using the negative-tone radiation-sensitive resin compositions (2) to (6) instead of the negative-tone radiation-sensitive resin composition (1), and were evaluated (evaluations 1 and 2). The evaluation results are shown in Table 2.

TABLE 1

|  | Alkali-soluble resin (A) | Radically polymerizable compound (B) | Radical initiator (C) | Organic solvent | Viscosity (cP) |
| --- | --- | --- | --- | --- | --- |
| Example 1 Composition (1) | A1/100 parts | B1/60 parts B2/10 parts | C1/10 parts C2/4 parts C3/0.2 parts | D1/102 parts | 1750 |
| Example 2 Composition (2) | A1/100 parts | B1/60 parts B2/10 parts | C1/10 parts C2/4 parts C3/0.2 parts | D2/107 parts | 1750 |
| Example 3 Composition (3) | A1/100 parts | B1/60 parts B2/10 parts | C1/10 parts C2/4 parts C3/0.2 parts | D3/132 parts | 1750 |
| Comparative Example 1 Composition (4) | A1/100 parts | B1/60 parts B2/10 parts | C1/10 parts C2/4 parts C3/0.2 parts | DR1/115 parts | 1750 |
| Comparative Example 2 Composition (5) | A1/100 parts | B1/60 parts B2/10 parts | C1/10 parts C2/4 parts C3/0.2 parts | DR2/110 parts | 1750 |

TABLE 1-continued

| | Alkali-soluble resin (A) | Radically polymerizable compound (B) | Radical initiator (C) | Organic solvent | Viscosity (cP) |
|---|---|---|---|---|---|
| Comparative Example 3 Composition (6) | A1/100 parts | B1/60 parts B2/10 parts | C1/10 parts C2/4 parts C3/0.2 parts | DR3/125 parts | 1750 |

The components shown in Table 1 are as follows.
A1: alkali-soluble resin A1 synthesized in Synthesis Example 1
B1: polyester acrylate (tri- or higher functional) ("Aronix M-8060" manufactured by Toagosei Co., Ltd.)
B2: trimethylolpropane PO-modified (n=2) triacylate ("Aronix M-320" manufactured by Toagosei Co., Ltd.)
C1: 2-methyl-1-[4-(methylthio)phenyl]-2-morpholinopropan-1-one ("Irgacure 907" manufactured by Ciba Specialty Chemicals)
C2: 2,2'-bis(2-chlorophenyl)-4,5,4',5'-tetraphenyl-1,2'-biimidazole
C3: 4,4'-bis(diethylamino)benzophenone
D1: diethylene glycol ethyl methyl ether (saturation vapor pressure (20° C., 1 atm): 0.94 mmHg, boiling point: 176° C.)
D2: diethylene glycol diethyl ether (saturation vapor pressure (20° C., 1 atm): 0.38 mmHg, boiling point: 188.9° C.)
D3: diethylene glycol monoethyl ether acetate (saturation vapor pressure (20° C., 1 atm): 0.05 mmHg, boiling point: 217.4° C.)
DR1: propylene glycol monomethyl ether acetate (saturation vapor pressure (20° C., 1 atm): 3.5 mmHg, boiling point: 146° C.)
DR2: propylene glycol monomethyl ether (saturation vapor pressure (20° C., 1 atm): 6.7 mmHg, boiling point: 121° C.)
DR3: ethyl lactate (saturation vapor pressure (20° C., 1 atm): 2.09 mmHg, boiling point: 154° C.)

could be formed in Examples 1 to 3 using an identical resin composition. On the other hand, only resin films having a thickness of about 15 to 47 μm could be formed in Comparative Examples 1 to 3.

The above results demonstrate that resin films that differ in thickness can be formed without changing the resin composition by changing the spin coating conditions, and the negative tone resin composition according to the embodiment of the invention may be suitably used to produce plating products (e.g., bumps or lines) that differ in height, for which an accuracy of the order of micrometers is desired.

According to the embodiment of the invention, the negative-tone radiation-sensitive resin composition makes it possible to form resin films that differ in thickness to a large extent by changing the spin coating conditions (e.g., the rotation speed and the rotation time of the substrate).

Therefore, plating products (e.g., bumps or lines) that differ in height can be accurately produced by utilizing a resist pattern formed using the above negative-tone radiation-sensitive resin composition as a mold.

Obviously, numerous modifications and variations of the present invention are possible in light of the above teachings. It is therefore to be understood that within the scope of the

TABLE 2

| | Rotation speed (rpm) | Rotation time (sec) | | | | | | Difference between maximum thickness and minimum thickness (μm) | Properties of film |
|---|---|---|---|---|---|---|---|---|---|
| | | 10 Thickness (μm) | 20 Thickness (μm) | 30 Thickness (μm) | 40 Thickness (μm) | 60 Thickness (μm) | 120 Thickness (μm) | | |
| Example 1 | 2400 | | 19.5 | | 14.5 | 13.1 | 12.3 | 35.1 | AA |
| | 1200 | 47.4 | 37.7 | 30.6 | 26.6 | 22.5 | | | |
| Example 2 | 2400 | | 18.5 | | 13.4 | 11.8 | 10.2 | 37.0 | AA |
| | 1200 | 47.2 | 37.5 | 30.0 | 25.7 | 21.0 | | | |
| Example 3 | 2400 | | 16.8 | | 11.5 | 9.6 | 7.3 | 39.7 | AA |
| | 1200 | 47.0 | 34.7 | 27.7 | 23.5 | 18.6 | | | |
| Comparative Example 1 | 2400 | | 20.3 | | 16.4 | 15.8 | 15.5 | 31.6 | AA |
| | 1200 | 47.1 | 38.8 | 31.1 | 27.3 | 24.2 | | | |
| Comparative Example 2 | 2400 | | 21.0 | | 17.4 | 16.6 | 16.6 | 30.7 | BB |
| | 1200 | 47.3 | 39.2 | 32.5 | 28.5 | 25.8 | | | |
| Comparative Example 3 | 2400 | | 20.0 | | 15.5 | 14.5 | 14.2 | 32.8 | AA |
| | 1200 | 47.0 | 38.0 | 30.8 | 27.0 | 23.3 | | | |

As shown in Table 2, resin films that differed in thickness to a large extent were obtained in Example 1 to 3 using an identical resin composition by changing the spin coating conditions. In Comparative Examples 1 to 3, resin films that differed in thickness to a large extent could not be obtained using an identical resin composition even if the spin coating conditions were changed.

Specifically, when the difference in rotation speed was 1200 rpm, resin films having a thickness of about 10 to 47 μm appended claims, the invention may be practiced otherwise than as specifically described herein.

The invention claimed is:

1. A negative-tone radiation-sensitive resin composition comprising:
   an alkali-soluble resin including a phenolic hydroxyl group;
   a radically polymerizable compound including an ethylenically unsaturated double bond;

a radiation-sensitive radical initiator; and
an organic solvent including an ethylene glycol organic solvent having a saturation vapor pressure of 3 mmHg or less at 20° C. and 1 atmosphere.

2. The negative-tone radiation-sensitive resin composition according to claim 1, wherein the content of the organic solvent is 60 to 300 parts by weight based on 100 parts by weight of the alkali-soluble resin.

3. The negative-tone radiation-sensitive resin composition according to claim 2, wherein the ethylene glycol organic solvent comprises at least one of diethylene glycol dialkyl ethers and diethylene glycol monoalkyl ether acetates.

4. The negative-tone radiation-sensitive resin composition according to claim 3, wherein the ethylene glycol organic solvent has a saturation vapor pressure of 1 mmHg or less at 20° C. and 1 atmosphere.

5. The negative-tone radiation-sensitive resin composition according to claim 4, wherein the alkali-soluble resin includes a structural unit shown by a following formula (1),

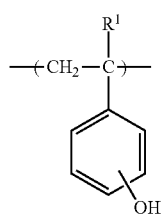
(1)

wherein $R^1$ represents a hydrogen atom or a methyl group.

6. The negative-tone radiation-sensitive resin composition according to claim 3, wherein the alkali-soluble resin includes a structural unit shown by a following formula (1),

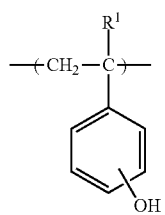
(1)

wherein $R^1$ represents a hydrogen atom or a methyl group.

7. The negative-tone radiation-sensitive resin composition according to claim 2, wherein the ethylene glycol organic solvent has a saturation vapor pressure of 1 mmHg or less at 20° C. and 1 atmosphere.

8. The negative-tone radiation-sensitive resin composition according to claim 7, wherein the alkali-soluble resin includes a structural unit shown by a following formula (1),

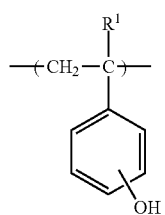
(1)

wherein $R^1$ represents a hydrogen atom or a methyl group.

9. The negative-tone radiation-sensitive resin composition according to claim 2, wherein the alkali-soluble resin includes a structural unit shown by a following formula (1),

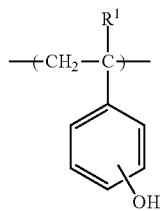
(1)

wherein $R^1$ represents a hydrogen atom or a methyl group.

10. The negative-tone radiation-sensitive resin composition according to claim 9, wherein the alkali-soluble resin further includes a structural unit shown by a following formula (2),

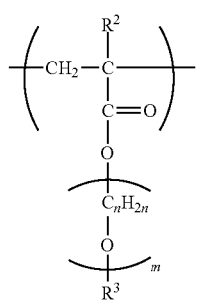
(2)

wherein $R^2$ represents a hydrogen atom or a methyl group, $R^3$ represents a linear hydrocarbon group having 6 to 12 carbon atoms, a cyclic hydrocarbon group having 6 to 12 carbon atoms, an aromatic hydrocarbon group having 6 to 12 carbon atoms, or a substituted hydrocarbon group obtained by substitution of at least one hydrogen atom of any of the above hydrocarbon groups with a hydrocarbon group, m is an integer from 1 to 10, and n is an integer from 2 to 4.

11. The negative-tone radiation-sensitive resin composition according to claim 1, wherein the ethylene glycol organic solvent comprises at least one of diethylene glycol dialkyl ethers and diethylene glycol monoalkyl ether acetates.

12. The negative-tone radiation-sensitive resin composition according to claim 11, wherein the ethylene glycol organic solvent has a saturation vapor pressure of 1 mmHg or less at 20° C. and 1 atmosphere.

13. The negative-tone radiation-sensitive resin composition according to claim 12, wherein the alkali-soluble resin includes a structural unit shown by a following formula (1),

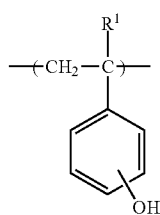
(1)

wherein $R^1$ represents a hydrogen atom or a methyl group.

14. The negative-tone radiation-sensitive resin composition according to claim 11, wherein the alkali-soluble resin includes a structural unit shown by a following formula (1),

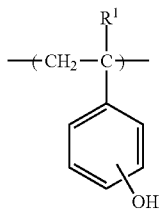
(1)

wherein $R^1$ represents a hydrogen atom or a methyl group.

15. The negative-tone radiation-sensitive resin composition according to claim 14, wherein the alkali-soluble resin further includes a structural unit shown by a following formula (2),

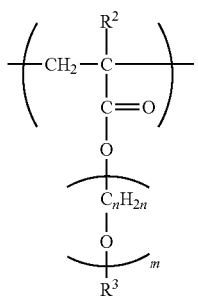
(2)

wherein $R^2$ represents a hydrogen atom or a methyl group, $R^3$ represents a linear hydrocarbon group having 6 to 12 carbon atoms, a cyclic hydrocarbon group having 6 to 12 carbon atoms, an aromatic hydrocarbon group having 6 to 12 carbon atoms, or a substituted hydrocarbon group obtained by substitution of at least one hydrogen atom of any of the above hydrocarbon groups with a hydrocarbon group, m is an integer from 1 to 10, and n is an integer from 2 to 4.

16. The negative-tone radiation-sensitive resin composition according to claim 1, wherein the ethylene glycol organic solvent has a saturation vapor pressure of 1 mmHg or less at 20° C. and 1 atmosphere.

17. The negative-tone radiation-sensitive resin composition according to claim 16, wherein the alkali-soluble resin includes a structural unit shown by a following formula (1),

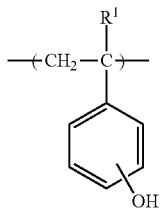
(1)

wherein $R^1$ represents a hydrogen atom or a methyl group.

18. The negative-tone radiation-sensitive resin composition according to claim 17, wherein the alkali-soluble resin further includes a structural unit shown by a following formula (2),

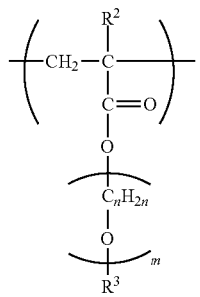
(2)

wherein $R^2$ represents a hydrogen atom or a methyl group, $R^3$ represents a linear hydrocarbon group having 6 to 12 carbon atoms, a cyclic hydrocarbon group having 6 to 12 carbon atoms, an aromatic hydrocarbon group having 6 to 12 carbon atoms, or a substituted hydrocarbon group obtained by substitution of at least one hydrogen atom of any of the above hydrocarbon groups with a hydrocarbon group, m is an integer from 1 to 10, and n is an integer from 2 to 4.

19. The negative-tone radiation-sensitive resin composition according to claim 1, wherein the alkali-soluble resin includes a structural unit shown by a following formula (1),

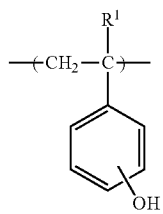
(1)

wherein $R^1$ represents a hydrogen atom or a methyl group.

20. The negative-tone radiation-sensitive resin composition according to claim 19, wherein the alkali-soluble resin further includes a structural unit shown by a following formula (2),

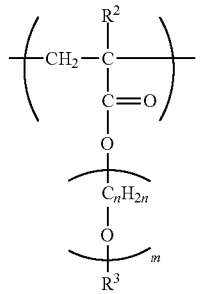
(2)

wherein $R^2$ represents a hydrogen atom or a methyl group, $R^3$ represents a linear hydrocarbon group having 6 to 12 carbon atoms, a cyclic hydrocarbon group having 6 to 12 carbon atoms, an aromatic hydrocarbon group having 6 to 12 carbon atoms, or a substituted hydrocarbon group obtained by substitution of at least one hydrogen atom of any of the above hydrocarbon groups with a hydrocarbon group, m is an integer from 1 to 10, and n is an integer from 2 to 4.

* * * * *